US012720920B2

(12) United States Patent
Yanai et al.

(10) Patent No.: US 12,720,920 B2
(45) Date of Patent: Aug. 25, 2026

(54) OPTICAL SEMICONDUCTOR ELEMENT

(71) Applicant: HAMAMATSU PHOTONICS K.K., Hamamatsu (JP)

(72) Inventors: Takahide Yanai, Hamamatsu (JP); Daisuke Iida, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 655 days.

(21) Appl. No.: 17/965,072

(22) Filed: Oct. 13, 2022

(65) Prior Publication Data

US 2023/0120130 A1 Apr. 20, 2023

(30) Foreign Application Priority Data

Oct. 18, 2021 (JP) ................................ 2021-170202

(51) Int. Cl.

| | |
|---|---|
| ***H10H 20/831*** | (2025.01) |
| ***H10F 77/14*** | (2025.01) |
| ***H10F 77/20*** | (2025.01) |
| ***H10F 77/30*** | (2025.01) |
| ***H10H 20/821*** | (2025.01) |
| ***H10H 20/84*** | (2025.01) |

(52) U.S. Cl.

CPC ....... *H10H 20/8314* (2025.01); *H10F 77/147* (2025.01); *H10F 77/206* (2025.01); *H10F 77/306* (2025.01); *H10H 20/821* (2025.01); *H10H 20/84* (2025.01)

(58) Field of Classification Search

CPC .................................................. H10H 20/8314

See application file for complete search history.

(56) References Cited

U.S. PATENT DOCUMENTS

| | | | | |
|---|---|---|---|---|
| 2017/0108173 A1* | 4/2017 | Kim | F21K 9/232 |
| 2018/0240952 A1 | 8/2018 | Moon et al. | |
| 2018/0351042 A1 | 12/2018 | Jang et al. | |
| 2020/0176636 A1* | 6/2020 | Chae | H10H 20/831 |
| 2021/0384182 A1* | 12/2021 | Xu | H10W 90/00 |
| 2022/0085240 A1* | 3/2022 | Cha | H10H 20/856 |
| 2022/0158037 A1* | 5/2022 | Kuo | H10H 20/8316 |
| 2023/0246149 A1* | 8/2023 | Kim | H10H 20/036<br>257/79 |

FOREIGN PATENT DOCUMENTS

| | | |
|---|---|---|
| JP | 2005-302747 A | 10/2005 |
| WO | WO-2017/043216 A1 | 3/2017 |

* cited by examiner

*Primary Examiner* — Ali Naraghi
(74) *Attorney, Agent, or Firm* — FAEGRE DRINKER BIDDLE & REATH LLP

(57) ABSTRACT

An optical semiconductor element includes: a substrate; a semiconductor stacked body including an optical layer, a first semiconductor layer, and a second semiconductor layer, the optical layer and the first semiconductor layer forming a mesa portion and the second semiconductor layer including an outer portion; a first electrode formed on the mesa portion and connected to the first semiconductor layer; a first insulating layer formed on the first electrode; a second electrode including a first portion connected to the second semiconductor layer at the outer portion and a second portion arranged on the first insulating layer so as to overlap the first electrode; and a second insulating layer formed on the second electrode. An opening for exposing the first electrode is formed in the first insulating layer. An opening for exposing the second portion of the second electrode is formed in the second insulating layer.

7 Claims, 4 Drawing Sheets

1
2
2a
2a
3
31
32
33
34
34a
34b
34c
35
4
4a
5
5a
5b
6
61
62
63
64
7
7a
7b
7c
8
8a
P1
P2
X
Y
Z 1
2
64
64a
64b
64c
64d
5b
7b
7
5a,7a
5
63
62
61
6
4
4a
3
P1
P2
X
Y
Z 1
2
2a
3
4
4a
5
5a
5b
6
61
62
63
64
7
7a
7b
7c
8
8a
31
32
33
34
34a
34b
34c
35
A
P1
P2
X
Y
Z 1
2a
61
5b
6
34b
63
2a
35
7b
62
P2
34a
7c
7
33
8
8a
P1
5a
31
5
4
32
4a
34c
3
34
64
2
X
Z
Y

OPTICAL SEMICONDUCTOR ELEMENT

TECHNICAL FIELD

One aspect of the present disclosure relates to an optical semiconductor element.

BACKGROUND

International Publication WO 2017/043216 describes a light emitting element including a substrate, a semiconductor stacked body formed on the substrate and having a mesa portion, and a p-side electrode and an n-side electrode formed on the mesa portion.

In the light emitting element described above, since the p-side electrode and the n-side electrode are arranged close to each other, a short circuit may occur between the p-side electrode and the n-side electrode at the time of mounting, for example. From the viewpoint of improving reliability, it is preferable that such a short circuit is suppressed. In addition, in the above-described light emitting element or light receiving element, improvement of light emission efficiency or light reception efficiency is also required.

SUMMARY

One aspect of the present disclosure is to provide an optical semiconductor element capable of improving light emission/reception efficiency and improving reliability.

An optical semiconductor element according to an aspect of the present disclosure includes: a substrate; a semiconductor stacked body including an optical layer that generates or absorbs light, a first semiconductor layer arranged on a side opposite to the substrate with respect to the optical layer, and a second semiconductor layer arranged on a side of the substrate with respect to the optical layer, the optical layer and the first semiconductor layer forming a mesa portion formed on the second semiconductor layer and the second semiconductor layer including an outer portion located outside the mesa portion; a first electrode formed on the mesa portion and electrically connected to the first semiconductor layer; a first insulating layer formed on the first electrode; a second electrode including a first portion electrically connected to the second semiconductor layer at the outer portion, a second portion arranged on the first insulating layer so as to overlap the first electrode in a thickness direction of the substrate, and a third portion electrically connected to the first portion and the second portion; and a second insulating layer formed on the second electrode. A first opening for exposing the first electrode is formed in the first insulating layer, and a second opening for exposing the second portion of the second electrode is formed in the second insulating layer.

In the optical semiconductor element, the second electrode includes the first portion electrically connected to the second semiconductor layer at the outer portion and the second portion arranged on the first insulating layer so as to overlap the first electrode in the thickness direction of the substrate. Therefore, for example, compared with a case where the entire second electrode is arranged on the outer portion of the second semiconductor layer, the area of the outer portion of the second semiconductor layer can be reduced, and the area of the mesa portion (optical layer) can be increased accordingly. As a result, it is possible to improve light emission/reception efficiency (light emission efficiency or light reception efficiency). In addition, in the optical semiconductor element, the first electrode is exposed from the first opening formed in the first insulating layer, and the second electrode is exposed from the second opening formed in the second insulating layer. Therefore, the insulation between the first electrode and the second electrode can be enhanced by the first insulating layer and the second insulating layer, and it is possible to suppress a short circuit between the first electrode and the second electrode. As a result, it is possible to improve the reliability. In addition, in the optical semiconductor element, between the exposed portion from the first opening in the first electrode and the exposed portion from the second opening in the second electrode, a stepped portion is formed by the first insulating layer and the second insulating layer. The insulation between the first electrode and the second electrode can also be enhanced by the stepped portion. Therefore, according to the optical semiconductor element, it is possible to improve the light emission/reception efficiency and improve the reliability.

The second insulating layer may be formed so as to extend from the second electrode to the first insulating layer, and a third opening connected to the first opening may be formed in a region of the second insulating layer, the region being on the first insulating layer. In this case, it is possible to more reliably suppress the short circuit between the first electrode and the second electrode.

When viewed from the thickness direction of the substrate, an outer edge of the first electrode may be located inside an outer edge of a top surface of the mesa portion. The first insulating layer may be arranged on a region of the top surface between the outer edge of the first electrode and the outer edge of the top surface. In this case, the first insulating layer can suppress a short circuit between the first electrode and the optical layer, and it is possible to further improve the reliability.

The first portion may include an extending portion that extends so as to surround the mesa portion when viewed from the thickness direction of the substrate. In this case, it is possible to increase the efficiency of carrier injection/extraction into/from the optical layer, and it is possible to further improve the light emission/reception efficiency.

The extending portion may extend so as to surround an entire circumference of the mesa portion when viewed from the thickness direction of the substrate. In this case, since it is possible to increase the efficiency of carrier injection/extraction into/from the optical layer, it is possible to further improve the light emission/reception efficiency.

The optical layer may be an active layer that generates light having a central wavelength of 3 μm or more and 10 μm or less or an absorption layer having a maximum sensitivity wavelength of 3 μm or more and 10 μm or less. In this case, it is difficult to increase the area of the element from the viewpoint of cost, and it is important to increase the light emission/reception efficiency per unit area. According to the optical semiconductor element, it is possible to improve the light emission/reception efficiency per unit area as described above.

According to an aspect of the present disclosure, it is possible to provide an optical semiconductor element capable of improving the light emission/reception efficiency and improving the reliability.

DETAILED DESCRIPTION

Figure 1:
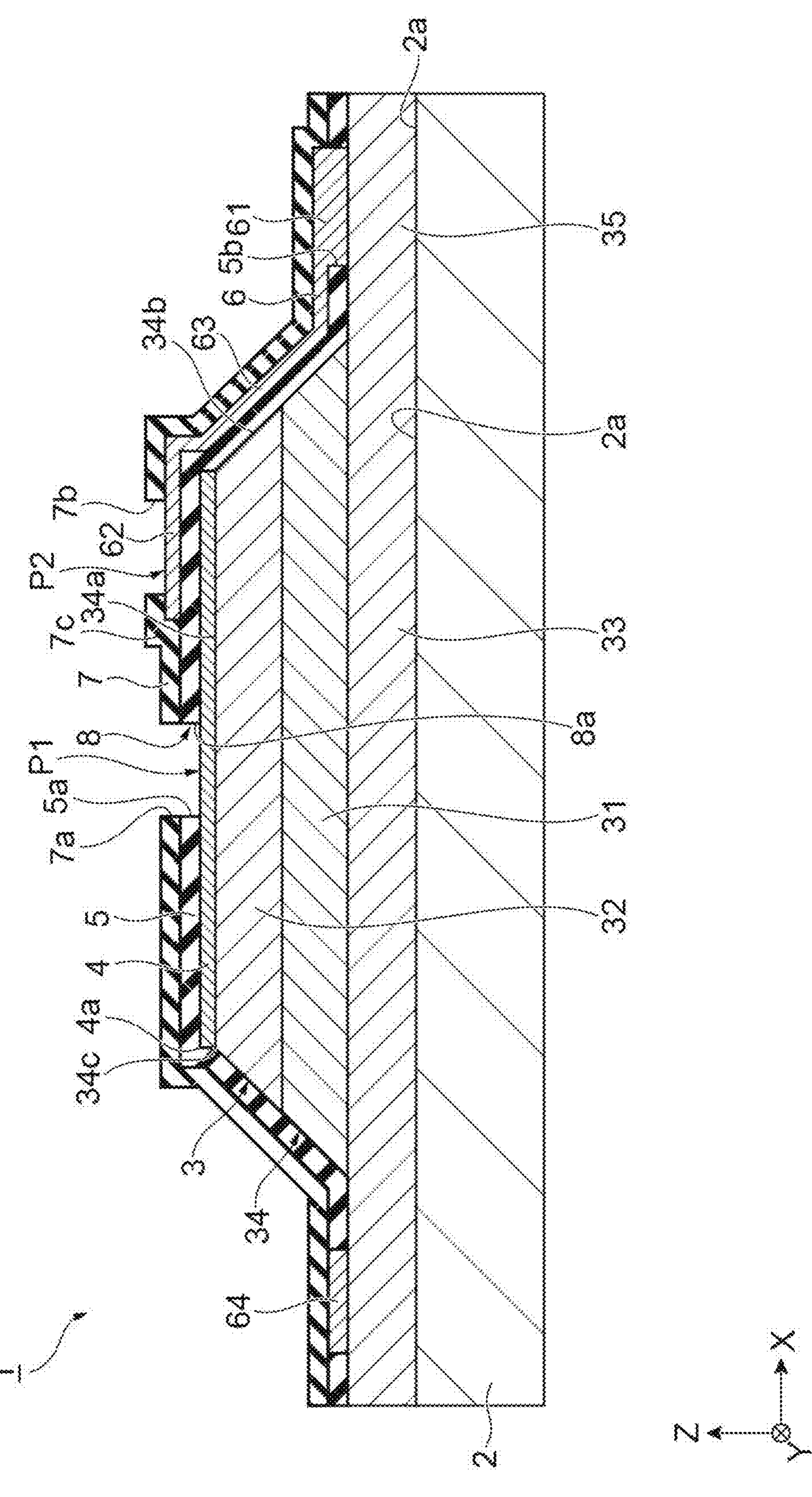
FIG. 1 is a cross-sectional view of an optical semiconductor element according to an embodiment.

Hereinafter, an embodiment of the present disclosure will be described in detail with reference to the diagrams. In the following description, the same or equivalent elements are denoted by the same reference numerals, and repeated description thereof will be omitted.

Figure 2:
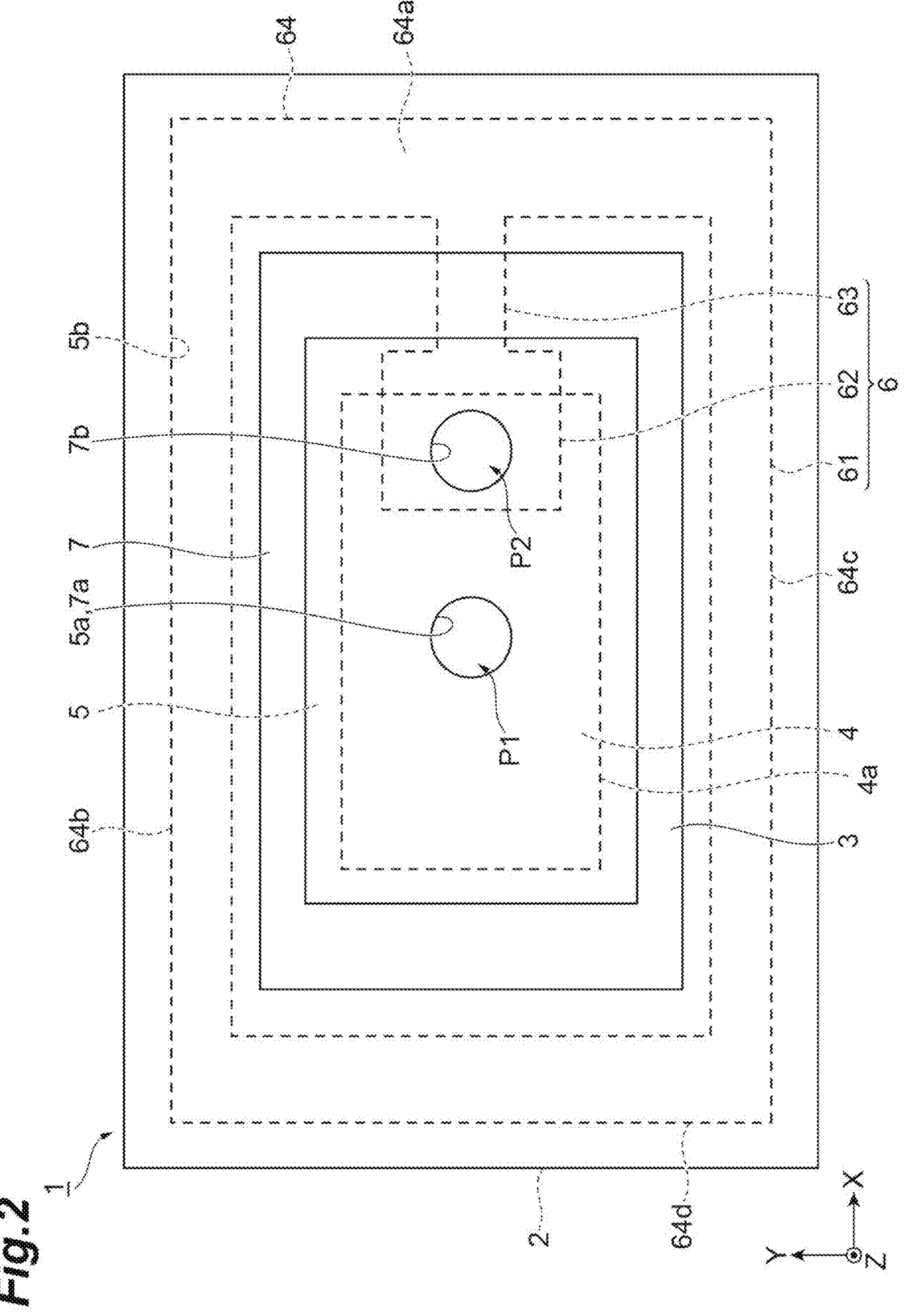
FIG. 2 is a plan view of the optical semiconductor element shown in FIG. 1.

As shown in FIGS. 1 and 2, an optical semiconductor element 1 includes a substrate 2 and a semiconductor stacked body (light emitting cell) 3 formed on the substrate 2. The semiconductor stacked body 3 has an optical layer 31, a first semiconductor layer 32, and a second semiconductor layer 33. The optical semiconductor element 1 is a light emitting element or a light receiving element. In this example, the optical semiconductor element 1 is configured as a light emitting diode (LED), and the light generated in the optical layer 31 is emitted through the substrate 2. The optical semiconductor element 1 is configured as a single cell LED having only one light emitting cell.

The substrate 2 is a semiconductor substrate having a light transmission property, and is formed in a rectangular plate shape by GaAs or semi-insulating GaAs, for example. The substrate 2 has a main surface 2*a*. Hereinafter, the thickness direction of the substrate 2 (direction perpendicular to the main surface 2*a*) will be described as a Z direction, the length direction of the substrate 2 (direction perpendicular to the Z direction) will be described as an X direction, and the width direction of the substrate 2 (direction perpendicular to the Z direction and the X direction) will be described as a Y direction.

As described above, the semiconductor stacked body 3 has the optical layer 31, the first semiconductor layer 32, and the second semiconductor layer 33. The second semiconductor layer 33, the optical layer 31, and the first semiconductor layer 32 are stacked in this order on the main surface 2*a* of the substrate 2. That is, the first semiconductor layer 32 is arranged on a side opposite to the substrate 2 with respect to the optical layer 31 (upper side in FIG. 1), and the second semiconductor layer 33 is arranged on the substrate 2 side with respect to the optical layer 31 (lower side in FIG. 1).

In this example, the optical layer 31 is an active layer that generates light, and is configured to generate light having a central wavelength of 3 μm or more and 10 μm or less. The optical layer 31 has, for example, a multiple quantum well structure in which a barrier layer formed of AlInAs and a well layer formed of InAsSb are alternately stacked. The optical layer 31 is formed, for example, in a rectangular shape when viewed from the Z direction. In this example, the optical layer 31 is formed in a rectangular shape having a long side along the X direction when viewed from the Z direction.

The first semiconductor layer 32 is a first conductive type (for example, p-type) semiconductor layer. For example, the first semiconductor layer 32 is formed by stacking a barrier layer, a buffer layer, and a contact layer on the optical layer 31 in this order. The second semiconductor layer 33 is a second conductive type (for example, n-type) semiconductor layer. For example, the second semiconductor layer 33 is formed by stacking a buffer layer, a contact layer, a current diffusion layer, and a barrier layer on the main surface 2*a* of the substrate 2 in this order. The material of each layer included in the first semiconductor layer 32 and the second semiconductor layer 33 can be appropriately selected depending on the material of the optical layer 31. As an example, in the first semiconductor layer 32, the barrier layer is formed of $Al_{0.20}InAs$, the buffer layer is formed of $Al_{0.05}InAs$, and the contact layer is formed of InAs. As an example, in the second semiconductor layer 33, the buffer layer is configured to include three layers of GaAs, GaSb, and InAs, the contact layer and the current diffusion layer are formed of $Al_{0.05}InAs$, and the barrier layer is formed of $Al_{0.20}InAs$.

The optical layer 31 and the first semiconductor layer 32 form a mesa portion 34 formed on the second semiconductor layer 33. The mesa portion 34 is formed so as to protrude from the second semiconductor layer 33 to the side opposite to the substrate 2. For example, the mesa portion 34 is formed in a trapezoidal shape in a cross section (FIG. 1) perpendicular to the main surface 2*a* of the substrate 2, and has a rectangular top surface 34*a* extending in parallel to the main surface 2*a* and a side surface 34*b* extending so as to be inclined in the Z direction. The top surface 34*a* is formed by a surface of the first semiconductor layer 32 on a side opposite to the optical layer 31. The mesa portion 34 is formed, for example, by stacking the optical layer 31, the first semiconductor layer 32, and the second semiconductor layer 33 on the substrate 2 and then removing parts of the optical layer 31, the first semiconductor layer 32, and the second semiconductor layer 33 by etching.

The second semiconductor layer 33 has an outer portion 35 located outside the mesa portion 34. Here, the "outside" means the side away from the center of the mesa portion 34 in the direction perpendicular to the Z direction. The outer portion 35 is formed, for example, in a rectangular ring shape so as to surround the entire circumference of the mesa portion 34 when viewed from the Z direction.

The optical semiconductor element 1 further includes a first electrode (anode) 4, a first insulating layer 5, a second electrode (cathode) 6, and a second insulating layer 7. The first electrode 4, the first insulating layer 5, the second electrode 6, and the second insulating layer 7 can also be regarded as forming a light emitting cell.

The first electrode 4 is formed on the entire top surface 34*a* of the mesa portion 34, and is electrically connected to the first semiconductor layer 32. The first electrode 4 is formed in a rectangular shape when viewed from the Z direction. In this example, an outer edge 4*a* of the first electrode 4 matches an outer edge 34*c* of the top surface 34*a* when viewed from the Z direction. The first electrode 4 is formed in a layered shape. For example, the first electrode 4 is formed by stacking a first layer formed of Ti, a second layer formed of Pt, and a third layer formed of Au on the top surface 34*a* in this order by vapor deposition.

The first insulating layer 5 is formed over the first electrode 4, the side surface 34*b* of the mesa portion 34, and the outer portion 35. The first insulating layer 5 is formed of, for example, $Al_2O_3$. An opening (first opening) 5*a* and an opening 5*b* are formed in the first insulating layer 5. The opening 5*a* is formed in a region of the first insulating layer 5 on the first electrode 4. The opening 5*a* is located on the central portion of the first electrode 4 when viewed from the Z direction. The opening 5*a* is formed in a circular shape, for example. The opening 5*b* is formed in a shape (rectangular ring shape in this example) corresponding to an extending portion 64 of a first portion 61 of the second electrode 6, which will be described later, when viewed from the Z direction.

The second electrode 6 is formed in a layered shape, and has, for example, a three-layer structure similar to the first electrode 4. The second electrode 6 has the first portion (connection portion) 61, a second portion (pad component portion) 62, and a third portion (wiring portion) 63. The first portion 61 is arranged on the outer portion 35, and is electrically connected to the second semiconductor layer 33 at the outer portion 35 through the opening 5*b*.

The first portion 61 has the extending portion 64 that extends so as to surround the mesa portion 34 when viewed from the Z direction. In this example, the extending portion 64 is formed in a rectangular ring shape when viewed from the Z direction, and extends so as to surround the entire circumference of the mesa portion 34. More specifically, the extending portion 64 has four portions 64*a*, 64*b*, 64*c*, and 64*d* extending straight along the four side portions of the mesa portion 34, respectively. The portion 64*a* is connected to the third portion 63, and extends along the Y direction. The portions 64*b* and 64*c* are connected to one end and the other end of the portion 64*a*, respectively, and extend in parallel with each other along the X direction. The portion 64*d* is connected to the portions 64*b* and 64*c* on a side opposite to the portion 64*a*, and extends in parallel with the portion 64*a*. The extending portion 64 is in contact with the outer portion 35 of the second semiconductor layer 33 through the opening 5*b*.

The second portion 62 is arranged on the first insulating layer 5 so as to overlap the first electrode 4 in the Z direction. In this example, the second portion 62 is formed in a rectangular shape when viewed from the Z direction, and is arranged so as to partially overlap the first electrode 4 but so as not to overlap the opening 5*a*. The length of the second portion 62 is shorter than the length of the first electrode 4 in both the X direction and the Y direction.

The third portion 63 is electrically connected to the first portion 61 and the second portion 62. The third portion 63 is arranged on the side surface 34*b* of the mesa portion 34 and the outer portion 35 with the first insulating layer 5 interposed therebetween. A portion of the third portion 63 arranged on the side surface 34*b* of the mesa portion 34 extends along the side surface 34*b* so as to be inclined in the Z direction. The third portion 63 is formed, for example, in a rectangular shape when viewed from the Z direction. The width of the third portion 63 in the Y direction is smaller than the width of the second portion 62 in the Y direction.

The second insulating layer 7 is formed over the first insulating layer 5 and the second electrode 6. That is, the second insulating layer 7 is formed so as to extend from the second electrode 6 to the first insulating layer 5. The second insulating layer 7 is formed of, for example, the same material as the first insulating layer 5. An opening (third opening) 7*a* and an opening (second opening) 7*b* are formed in the second insulating layer 7.

The opening 7*a* is formed in a region of the second insulating layer 7 on the first insulating layer 5. The opening 7*a* is formed at a position corresponding to the opening 5*a* when viewed from the Z direction, and is connected to the opening 5*a* (continuous with the opening 5*a*). The opening 7*a* is formed, for example, in the same circular shape as the opening 5*a*. The opening 7*a* exposes the first electrode 4 together with the opening 5*a*. That is, the first electrode 4 is exposed to the outside of the optical semiconductor element 1 through the openings 5*a* and 7*a*. The exposed portion from the openings 5*a* and 7*a* in the first electrodes 4 forms a first pad portion P1 for electrical connection with an external member.

The opening 7*b* is located at a position overlapping the second portion 62 of the second electrode 6 in the Z direction. The opening 7*b* is located so as to be aligned with the opening 7*a* in the X direction, for example. The opening 7*b* is formed in a circular shape, for example. The opening 7*b* exposes the second portion 62 of the second electrode 6. That is, the second portion 62 of the second electrode 6 is exposed to the outside of the optical semiconductor element 1 through the opening 7*b*. The exposed portion from the opening 7*b* in the second portion 62 forms a second pad portion P2 for electrical connection with an external member. The second insulating layer 7 has a stepped portion 7*c*. The stepped portion 7*c* is formed so that the second insulating layer 7 rides on the second portion 62 of the second electrode 6 from above the first insulating layer 5, thereby being formed at a position corresponding to the edge of the second electrode 6. The stepped portion 7*c* is formed at the boundary between a portion of the second insulating layer 7 arranged on the second portion 62 and a portion of the second insulating layer 7 arranged on the first insulating layer 5.

A stepped portion 8 is formed between the first pad portion P1 and the second pad portion P2 by the first insulating layer 5 and the second insulating layer 7. That is, the exposed portion (second pad portion P2) from the opening 7*b* in the second portion 62 is arranged at a position far from the substrate 2 compared with the exposed portion (first pad portion P1) from the openings 5*a* and 7*a* in the first electrode 4 because the first insulating layer 5 is interposed between the first electrode 4 and the second electrode 6. By arranging the first insulating layer 5 and the second insulating layer 7 between such exposed portions, the stepped portion 8 is formed between the first pad portion P1 and the second pad portion P2. The stepped portion 8 has a stepped surface 8*a* formed by the inner surfaces of the openings 5*a* and 7*a* formed in the first insulating layer 5 and the second insulating layer 7.

The optical semiconductor element 1 is mounted, for example, by being electrically connected to an external member, on which an electrical circuit is formed, by soldering (bump). At the time of this mounting, each of the first pad portion P1 and the second pad portion P2 is connected to the external member by, for example, soldering. Each of the first pad portion P1 and the second pad portion P2 may be connected to the external member by an Au bump or an In bump. During the operation of the optical semiconductor element 1, for example, a voltage is applied between the first pad portion P1 (first electrode 4) and the second pad portion P2 (second electrode 6) through the external member. As a result, in the semiconductor stacked body 3, carriers are injected into the optical layer 31 to generate light, and the generated light is emitted through the substrate 2.

FUNCTIONS AND EFFECTS

In the optical semiconductor element 1, the second electrode 6 has the first portion 61 electrically connected to the second semiconductor layer 33 at the outer portion 35 and the second portion 62 arranged on the first insulating layer 5 so as to overlap the first electrode 4 in the thickness direction of the substrate 2. Therefore, for example, compared with a case where the entire second electrode 6 is arranged on the outer portion 35 of the second semiconductor layer 33, the area of the outer portion 35 of the second semiconductor layer 33 can be reduced, and the area of the mesa portion 34 (optical layer 31) can be increased accordingly. As a result, it is possible to improve the light emission efficiency. In addition, in the optical semiconductor element 1, the first electrode 4 is exposed from the opening 5*a* formed in the first insulating layer 5, and the second electrode 6 is exposed from the opening 7*b* formed in the second insulating layer 7. Therefore, since the insulation between the first electrode 4 and the second electrode 6 can be enhanced by the first insulating layer 5 and the second insulating layer 7, it is possible to suppress a short circuit between the first electrode 4 and the second electrode 6. As a result, it is possible to improve the reliability of the optical semiconductor element 1. In addition, in the optical semiconductor element 1, between the exposed portion from the opening 5*a* in the first electrode 4 and the exposed portion from the opening 7*b* in the second electrode 6, the stepped portion 8 is formed by the first insulating layer 5 and the second insulating layer 7. The insulation between the first electrode 4 and the second electrode 6 can also be enhanced by the stepped portion 8. Therefore, according to the optical semiconductor element 1, it is possible to improve the light emission efficiency and improve the reliability.

More specifically, in the optical semiconductor element 1, the first insulating layer 5 is formed between the first electrode 4 and the second electrode 6 on the top surface 34*a* of the mesa portion 34, and the height from the substrate 2 to the first electrode 4 and the height from the substrate 2 to the second electrode 6 are different. Therefore, since the insulation between the first electrode 4 and the second electrode 6 can be enhanced, it is possible to suppress a short circuit between the first electrode 4 and the second electrode 6. In addition, in the optical semiconductor element 1, the first electrode 4 is exposed from the openings 5*a* and 7*a* formed in the first insulating layer 5 and the second insulating layer 7 on the top surface 34*a* of the mesa portion 34, and the second electrode 6 is exposed from the opening 7*b* formed in the second insulating layer 7. Since this can also enhance the insulation between the first electrode 4 and the second electrode 6, it is possible to suppress a short circuit between the first electrode 4 and the second electrode 6. In addition, in the optical semiconductor element 1, the second insulating layer 7 has the stepped portion 7*c* formed at the boundary between the portion of the second insulating layer 7 arranged on the second portion 62 and the portion of the second insulating layer 7 arranged on the first insulating layer 5. For this reason, for example, even if the amount of solder arranged in the openings 5*a* and 7*a* at the time of mounting the optical semiconductor element 1 is larger than the target amount and the solder leaks to the outside of the opening 7*a*, the solder is blocked by the stepped portion 7*c*. Therefore, the solder tends not to come into contact with a portion of the second electrode 6 exposed from the opening 7*b*. Since this can also enhance the insulation between the first electrode 4 and the second electrode 6, it is possible to suppress a short circuit between the first electrode 4 and the second electrode 6. As a result, it is possible to improve the reliability of the optical semiconductor element 1.

The second insulating layer 7 is formed so as to extend from the second electrode 6 to the first insulating layer 5, and the opening 7*a* connected to the opening 5*a* is formed in a region of the second insulating layer 7 on the first insulating layer 5. Therefore, since the opening in the first pad portion P1 can be deepened, it is possible to more reliably suppress the short circuit between the first electrode 4 and the second electrode 6.

The first portion 61 has the extending portion 64 that extends so as to surround the mesa portion 34 when viewed from the Z-axis direction. Therefore, since it is possible to increase the efficiency of carrier injection into the optical layer 31, it is possible to further improve the light emission efficiency.

The extending portion 64 extends so as to surround the entire circumference of the mesa portion 34 when viewed from the Z-axis direction. In this case, since it is possible to increase the efficiency of carrier injection into the optical layer 31, it is possible to further improve the light emission efficiency.

The optical layer 31 is an active layer that generates light having a central wavelength of 3 μm or more and 10 μm or less. In this case, unlike a case where light having a central wavelength shorter than 3 μm is generated, it is difficult to increase the area of the element from the viewpoint of cost, and it is important to increase the light emission efficiency per unit area. According to the optical semiconductor element 1, it is possible to improve the light emission efficiency per unit area as described above.

MODIFICATION EXAMPLES

Figure 3:
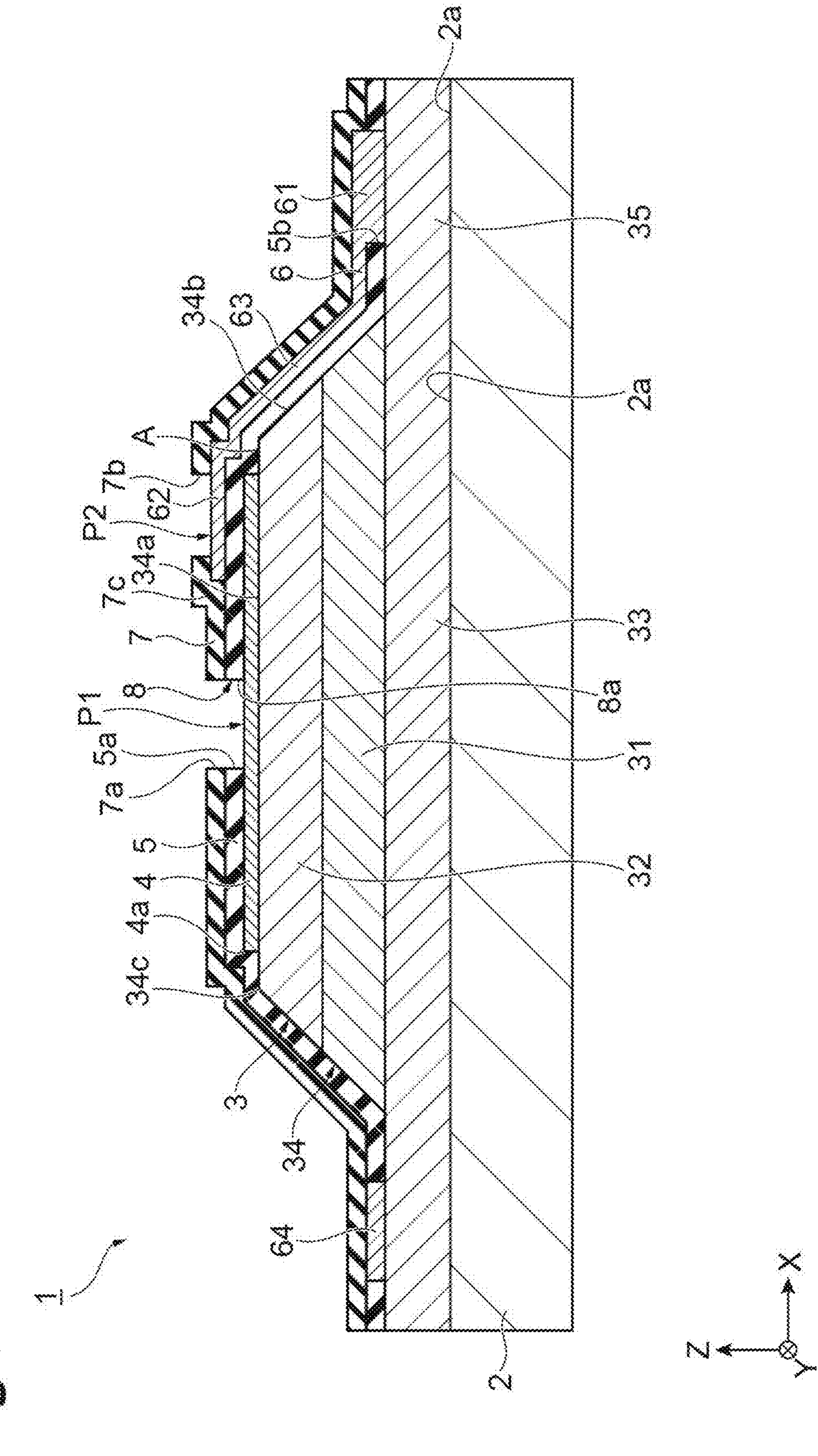
FIG. 3 is a cross-sectional view of an optical semiconductor element of a first modification example.

The optical semiconductor element 1 may be configured as in a first modification shown in FIG. 3. In the first modification example, the outer edge 4*a* of the first electrode 4 is located inside the outer edge 34*c* of the top surface 34*a* of the mesa portion 34 over the entire circumference when viewed from the Z-axis direction. That is, the first electrode 4 is formed to be one size smaller than the top surface 34*a* of the mesa portion 34. The first insulating layer 5 is arranged on a region A of the top surface 34*a* between the outer edge 4*a* and the outer edge 34*c*. When viewed from the Z-axis direction, the region A extends so as to surround the entire circumference of the outer edge 4*a* of the first electrode 4.

Also in the first modification example, similar to the embodiment described above, it is possible to improve the light emission efficiency and improve the reliability. In addition, in the first modification example, when viewed from the Z-axis direction, the outer edge 4*a* of the first electrode 4 is located inside the outer edge 34*c* of the top surface 34*a* of the mesa portion 34, and the first insulating layer 5 is arranged on the region A of the top surface 34*a* between the outer edge 4*a* of the first electrode 4 and the outer edge 34*c* of the top surface 34*a*. Therefore, since the first insulating layer 5 can suppress a short circuit between the first electrode 4 and the optical layer 31, it is possible to further improve the reliability. Such a configuration is particularly effective when the thickness of the first semiconductor layer 32 is small and a short circuit is likely to occur between the first electrode 4 and the optical layer 31.

Figure 4:
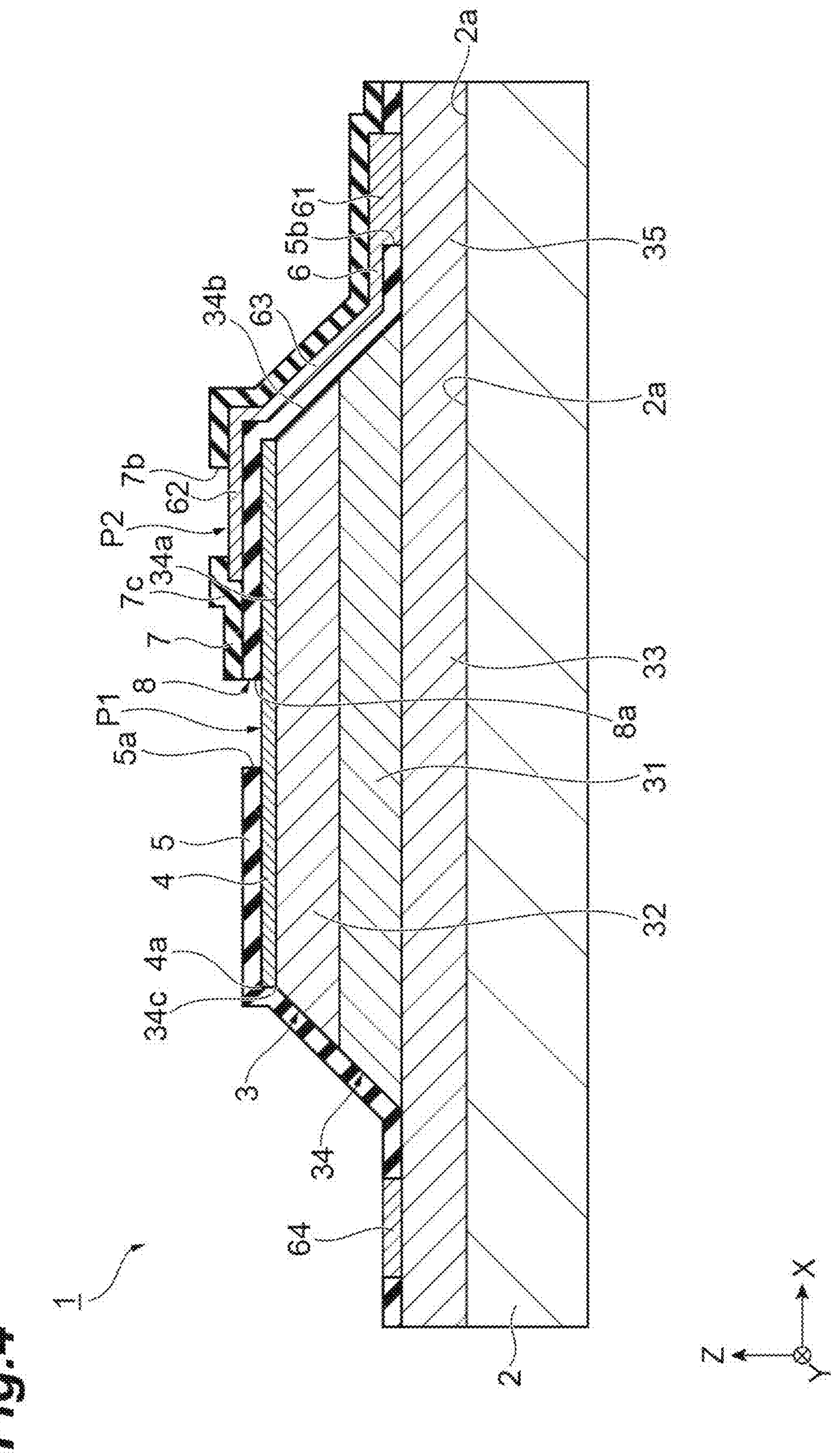
FIG. 4 is a cross-sectional view of an optical semiconductor element of a second modification example.

The optical semiconductor element 1 may be configured as in a second modification shown in FIG. 4. In the second modification example, the second insulating layer 7 covers only a region on the opening 7*b* side with respect to the opening 5*a* in the first insulating layer 5, and does not cover a region on a side opposite to the opening 7*b* with respect to the opening 5*a* in the first insulating layer 5. In the second modification example as well, as in the embodiment described above, the second insulating layer 7 is arranged between the openings 5*a* and 7*b*, and the stepped portion 8 is formed between the first pad portion P1 and the second pad portion P2. Also in the second modification example, similar to the embodiment described above, it is possible to improve the light emission efficiency and improve the reliability.

The present disclosure is not limited to the embodiment and the modification example described above. For example, the material and shape of each component are not limited to the materials and shapes described above, and various materials and shapes can be adopted. In the embodiment described above, the optical layer 31 has a multiple quantum well structure, but the optical layer 31 may be configured as a single layer. The material of the optical layer 31 is not limited to the example in the embodiment described above, and the optical layer 31 may be formed of a material containing at least one of InAsSb, AlInSb, and AlInAs. The optical layer 31 may be formed of a material containing Sb and In. The optical layer 31 may be formed of a material containing Sb. Even in these cases, the optical layer 31 can be configured as an active layer that generates light having a central wavelength of 3 μm or more and 10 μm or less. The optical layer 31 may be an active layer that generates light having a central wavelength of 3 μm or more and 8 μm or less. The first electrode 4 and the second electrode 6 may be formed of a metal material other than those described above. The first insulating layer 5 and the second insulating layer 7 may be formed of an insulating material other than those described above. The openings 5*a*, 5*b*, 7*a*, and 7*b* may be formed in any shape.

In the embodiment described above, the opening 7*a* connected to the opening 5*a* is formed in the second insulating layer 7, but the opening 7*a* may not be formed in the second insulating layer 7. In this case, the second insulating layer 7 may be formed only in the region corresponding to the second electrode 6 when viewed from the Z direction, for example.

In the embodiment described above, the extending portion 64 of the first portion 61 of the second electrode 6 surrounds the entire circumference of the mesa portion 34, but the extending portion 64 may partially surround the circumference of the mesa portion 34. For example, in the embodiment described above, the portions 64*c* and 64*d* of the extending portion 64 may not be connected to each other, and a gap may be formed between the portions 64*c* and 64*d*. Also in this case, the extending portion 64 extends along at least a part of each of the four side portions of the mesa portion 34 when viewed from the Z direction. Alternatively, the portion 64*d* may be omitted, and the extending portion 64 may be formed in a U shape (inverted C shape) when viewed from the Z direction. When the extending portion 64 partially surrounds the circumference of the mesa portion 34, the extending portion 64 may be formed so as to surround 50% or more of the peripheral length of the mesa portion 34 when viewed from the Z direction or may be formed so as to surround 80% or more of the peripheral length of the mesa portion 34 when viewed from the Z direction. In addition, in the embodiment described above, the extending portion 64 extends in two different directions starting from the intersection with the third portion 63 (the direction surrounding the mesa portion 34 clockwise and the direction surrounding the mesa portion 34 counterclockwise in FIG. 2). However, when the extending portion 64 partially surrounds the mesa portion 34, the extending portion 64 may extend in only one direction starting from the intersection with the third portion 63. When the extending portion 64 extends in two directions starting from the intersection with the third portion 63, the length from the intersection with the third portion 63 to the distal end of the extending portion 64 can be shortened as compared with the case where the extending portion 64 extends in only one direction. Therefore, since it is possible to increase the efficiency of carrier injection into the optical layer 31, it is possible to improve the light emission efficiency.

As another modification example, the optical semiconductor element 1 may be configured as a light receiving element. In this modification example, the optical semiconductor element 1 is configured as, for example, a photodiode. The optical layer 31 is an absorption layer that absorbs light, and is configured to have a maximum sensitivity wavelength of, for example, 3 μm or more and 10 μm or less. The optical layer 31 may be an absorption layer having a maximum sensitivity wavelength of 3 μm or more and 8 μm or less. The optical layer 31 is configured in the same manner as the optical layer 31 of the above embodiment, for example. In the semiconductor stacked body 3, light incident through the substrate 2 is absorbed by the optical layer 31, and carriers are generated in the optical layer 31. The generated carriers are extracted through the first pad portion P1 (first electrode 4) and the second pad portion P2 (second electrode 6). According to such a modification example, for the same reason as in the embodiment described above, it is possible to improve the light reception efficiency and improve the reliability.

In the embodiment described above, the mesa portion 34 is formed in a trapezoidal shape in the cross section perpendicular to the main surface 2*a* of the substrate 2 (FIG. 1), but the mesa portion 34 may be formed in a rectangular shape in the cross section perpendicular to the main surface 2*a* of the substrate 2. In this case, the side surface 34*b* may extend along the Z direction.

The material of each component is not limited to those described above. As an example, the substrate 2 may be formed of Si. The barrier layer of the first semiconductor layer 32 may be formed of $(AlGa)_{0.20}In_{0.80}As$, and the buffer layer and the contact layer of the first semiconductor layer 32 may be formed of $In_{0.87}GaAs$. The buffer layer of the second semiconductor layer 33 may be formed to have three layers formed of GaAs, low temperature InAs, and $In_{0.87}GaAs$, respectively, the contact layer and the current diffusion layer of the second semiconductor layer 33 may be formed of $In_{0.87}GaAs$, and the barrier layer of the second semiconductor layer 33 may be formed of $(AlGa)_{0.20}In_{0.80}As$. The first insulating layer 5 and the second insulating layer 7 may be formed of $SiO_2$. As another example, the substrate 2 may be formed of SI—InP. The barrier layer of the first semiconductor layer 32 may be formed of $Al_{0.15}InAs$, and the buffer layer and the contact layer of the first semiconductor layer 32 may be formed of InAs. The buffer layer of the second semiconductor layer 33 may be formed to have three layers formed of GaAs, low temperature InAs, and InAs, respectively, the contact layer and the current diffusion layer of the second semiconductor layer 33 may be formed of InAs, and the barrier layer of the second semiconductor layer 33 may be formed of $Al_{0.15}InAs$. The first insulating layer 5 and the second insulating layer 7 may be formed of SiN. As another example, the buffer layer of the second semiconductor layer 33 may be formed to have three layers formed of GaAs, InAs, and $In_{0.87}GaAs$, respectively.

The substrate 2 may be formed in a square shape, a circular shape, or an elliptical shape when viewed from the Z direction. The optical layer 31, the first semiconductor layer 32, and the second semiconductor layer 33 may be formed in a square shape, a circular shape, or an elliptical shape when viewed from the Z direction. The first electrode 4 and the second portion 62 of the second electrode 6 may be formed in a square shape, a circular shape, or an elliptical shape when viewed from the Z direction. In addition, the second insulating layer 7 does not have to cover the first portion 61 and the third portion 63 of the second electrode 6.

In the embodiment described above, the openings 5*a* and 7*a* are formed so as to be located on the central portion of the first electrode 4 when viewed from the Z direction, but the openings 5*a* and 7*a* may be formed near the edge of the first electrode 4 when viewed from the Z direction. For example, the openings 5*a* and 7*a* may be formed at a position farther from the opening 7*b* than the central portion of the first electrode 4 when viewed from the Z direction. In this case, the distance between the openings 5*a* and 7*a* and the opening 7*b* is secured to be larger than that in a case where the openings 5*a* and 7*a* are formed so as to be located on the central portion of the first electrode 4. Therefore, it is possible to further suppress a short circuit between the first electrode 4 and the second electrode 6. In addition, in the case where each of the openings 5*a* and 7*a* and the opening 7*b* is formed near the edge of the first electrode 4, the area where each opening can be formed increases as compared with a case where either the openings 5*a* and 7*a* or the opening 7*b* is formed in the central portion of the first electrode 4. Therefore, it is possible to improve the degree of freedom in designing the sizes and shapes of the openings 5*a* and 7*a* and the opening 7*b*.

In the embodiment described above, the opening 7*a* is formed in the same circular shape as the opening 5*a*, but the opening 7*a* may have a size or shape different from that of the opening 5*a*. As an example, the opening 7*a* may be formed larger than the opening 5*a* when viewed from the Z direction. In this case, since the stepped surface 8*a* has a staircase shape, the surface area of the stepped surface 8*a* increases as compared with a case where the opening 7*a* has the same size as the opening 5*a*. Therefore, for example, even if the amount of solder arranged in the openings 5*a* and 7*a* at the time of mounting the optical semiconductor element 1 is larger than the target amount, it is possible to suppress the leakage of the solder to the outside of the opening 7*a*. As a result, it is possible to suppress a short circuit between the first electrode 4 and the second electrode 6.

What is claimed is:

1. An optical semiconductor element, comprising:

a substrate;

a semiconductor stacked body including an optical layer that generates or absorbs light, a first semiconductor layer arranged on a side opposite to the substrate with respect to the optical layer, and a second semiconductor layer arranged on a side of the substrate with respect to the optical layer, the optical layer and the first semiconductor layer forming a mesa portion formed on the second semiconductor layer and the second semiconductor layer including an outer portion located outside the mesa portion;

a first electrode formed on the mesa portion and electrically connected to the first semiconductor layer;

a first insulating layer formed on the first electrode;

a second electrode including a first portion electrically connected to the second semiconductor layer at the outer portion, a second portion arranged on the first insulating layer so as to overlap the first electrode in a thickness direction of the substrate, and a third portion electrically connected to the first portion and the second portion; and a second insulating layer formed on the second electrode, wherein a first opening for exposing the first electrode is formed in the first insulating layer, a second opening for exposing the second portion of the second electrode is formed in the second insulating layer, at least a part of an upper surface of the first electrode is located nearer to the substrate than an upper surface of the second electrode, a third opening connected to the first opening is formed in a region of the second insulating layer on the first insulating layer, the third opening overlaps the first opening when viewed in a plan view of the optical semiconductor element, and when viewed in the plan view of the optical semiconductor element, the third portion extends along a first direction from the first portion toward the second portion, and a width of the third portion in a second direction perpendicular to the first direction is smaller than a width of the second portion in the second direction.

2. The optical semiconductor element according to claim 1, wherein the second insulating layer is formed so as to extend from the second electrode to the first insulating layer, and a third opening connected to the first opening is formed in a region of the second insulating layer, the region being on the first insulating layer.

3. The optical semiconductor element according to claim 1, wherein, when viewed from the thickness direction of the substrate, an outer edge of the first electrode is located inside an outer edge of a top surface of the mesa portion, and the first insulating layer is arranged on a region of the top surface between the outer edge of the first electrode and the outer edge of the top surface.

4. The optical semiconductor element according to claim 1, wherein the first portion includes an extending portion that extends so as to surround the mesa portion when viewed from the thickness direction of the substrate.

5. The optical semiconductor element according to claim 4, wherein the extending portion extends so as to surround an entire circumference of the mesa portion when viewed from the thickness direction of the substrate.

6. The optical semiconductor element according to claim 1, wherein the optical layer is an active layer that generates light having a central wavelength of 3 μm or more and 10 μm or less or an absorption layer having a maximum sensitivity wavelength of 3 μm or more and 10 μm or less.

7. The optical semiconductor element according to claim 1, wherein the second insulating layer is formed on an upper surface of the second electrode.

* * * * *